US009962733B2

(12) United States Patent
Perego et al.

(10) Patent No.: US 9,962,733 B2
(45) Date of Patent: May 8, 2018

(54) PROCESS FOR MANUFACTURING SELF-ASSEMBLED BLOCK COPOLYMER FILMS

(71) Applicant: CONSIGLIO NAZIONALE DELLE RICERCHE, Rome (IT)

(72) Inventors: Michele Perego, Rome (IT); Gabriele Seguini, Rome (IT); Federico Ferrarese Lupi, Rome (IT)

(73) Assignee: CONSIGLIO NAZIONALE DELLE RICERCHE, Rome (IT)

( * ) Notice: Subject to any disclaimer, the term of this patent is extended or adjusted under 35 U.S.C. 154(b) by 209 days.

(21) Appl. No.: 14/890,240

(22) PCT Filed: May 9, 2014

(86) PCT No.: PCT/IB2014/061324
§ 371 (c)(1),
(2) Date: Nov. 10, 2015

(87) PCT Pub. No.: WO2014/181302
PCT Pub. Date: Nov. 13, 2014

(65) Prior Publication Data
US 2016/0082472 A1 Mar. 24, 2016

(30) Foreign Application Priority Data

May 10, 2013 (IT) .............................. RM2013A0278

(51) Int. Cl.
*B05D 3/06* (2006.01)
*C09D 153/00* (2006.01)
(Continued)

(52) U.S. Cl.
CPC ............... *B05D 3/06* (2013.01); *B05D 1/005* (2013.01); *B05D 3/007* (2013.01); *C09D 153/00* (2013.01);
(Continued)

(58) Field of Classification Search
CPC ........ B04D 1/005; B05D 3/007; B82Y 30/00; B82Y 40/00; C09D 153/00
See application file for complete search history.

(56) References Cited

U.S. PATENT DOCUMENTS

2002/0190415 A1 12/2002 Yang et al.
2005/0159293 A1 7/2005 Wan et al.
(Continued)

FOREIGN PATENT DOCUMENTS

WO     WO 02/31002     4/2002
WO     WO 2011/094857     8/2011
WO     WO 2012/106120     8/2012

OTHER PUBLICATIONS

Hahn et al. The Journal of Chemical Physics 114, 4730-4740 (2001).*

(Continued)

*Primary Examiner* — Mark S Kaucher
(74) *Attorney, Agent, or Firm* — Nixon & Vanderhye P.C.

(57) ABSTRACT

Self-assembled block copolymer films having two or more blocks are manufactured by distributing a solution containing at least one block copolymer onto the substrate so as to partially coat a substrate surface, obtaining an intermediate product. A block copolymer is self-assembled by heating the intermediate product. The self-assembling step includes Rapid Thermal Processing, which is performed by heating the intermediate product up to a first target temperature, ranging from a glass transition temperature to an order-disorder transition temperature of the block copolymer, through a temperature rising ramp having a rate of temperature change not lower than 5° C./second; maintaining the intermediate product at the target temperature for a time interval not longer than 60 minutes, whereby a sample is obtained on the surface of which a self-assembled film of the (Continued)

block copolymer has been made; and cooling the sample down to the ambient temperature through a temperature descending ramp.

20 Claims, 2 Drawing Sheets (51) Int. Cl.
G03F 7/00 (2006.01)
B05D 1/00 (2006.01)
B05D 3/00 (2006.01)
B82Y 30/00 (2011.01)
B82Y 40/00 (2011.01)

(52) U.S. Cl.
CPC ............ *G03F 7/0002* (2013.01); *B82Y 30/00* (2013.01); *B82Y 40/00* (2013.01)

(56) References Cited

U.S. PATENT DOCUMENTS

| 2011/0256359 A1 | 10/2011 | Colburn et al. |
| 2012/0094087 A1 | 4/2012 | Millward et al. |
| 2012/0223053 A1 | 9/2012 | Millward et al. |

OTHER PUBLICATIONS

International Search Report dated Jul. 8, 2014 issued in PCT International Patent Application No. PCT/IB2014/061324, 3 pp.
Andreozzi, A. et al., "The Fabrication of Tunable Nanoporous Oxide Surfaces by Block Copolymer Lithography and Atomic Layer Deposition," Nanotechnology 22 (2011) 335303, pp. 1-8.
Bang, Joona et al., "Block Copolymer Nanolithography: Translation of Molecular Level Control to Nanoscale Patterns," Advanced Materials, vol. 21, Issue 47, Dec. 18, 2009, pp. 4769-4792.
Liu, Guoliang et al., "Nonbulk Complex Structures in Thin Films of Symmetric Block Copolymers on Chemically Nanopatterned Surfaces," Macromolecules, 2012, 45 (9), pp. 3986-3992.
Mansky, P. et al., "Controlling Polymer-Surface Interactions with Random Copolymer Brushes," Science, vol. 275, Mar. 7, 1997, pp. 1458-1460.
Ruiz, Ricardo et al., "Local Defectivity Control of 2D Self-Assembled Block Copolymer Patterns," Advanced Materials, vol. 19, No. 16, Aug. 17, 2007, pp. 2157-2162.
Segalman, Rachel A., "Patterning with Block Copolymer Thin Films," Materials Science and Engineering R 48 (2005), pp. 191-226.
Tang, Jaw-Luen et al., "Rapid Formation of Block Copolymer Thin Film Based on Infrared Laser Irradiation," Lasers and Electro-Optics—Pacific Rim, 2007, Cleo/Pacific Rim 2007 Conference, Aug. 26, 2007, pp. 1-2.

* cited by examiner

PROCESS FOR MANUFACTURING SELF-ASSEMBLED BLOCK COPOLYMER FILMS

This application is the U.S. national phase of International Application No. PCT/IB2014/061324 filed May 9, 2014 which designated the U.S. and claims priority to Italian Patent Application No. RM2013A000278 filed May 10, 2013, the entire contents of each of which are hereby incorporated by reference.

The present invention relates to a process for manufacturing self-assembled block copolymer films that permits to accurately control the manufacture of self-assembled block copolymer films and the related physico-chemical properties in an efficient, reliable, quick, easy-to-manage and inexpensive way.

In the last decades, developments in manufacturing technology of microelectronic devices have led to an increasingly advanced miniaturisation of the manufactured devices. However, in order to make microelectronic devices with feature size smaller than 30 nanometers, such as those employed in nanotechnologies, the photolithographic techniques conventionally used for manufacturing such devices are inadequate, due to the intrinsic limitations imposed by the optical diffraction of light sources.

This has entailed the development of techniques alternative to the conventional photolithography, also known as nanolithographic techniques. These techniques make use of nanostructured films composed of self-assembled block copolymers (BCP: Block CoPolymer).

In this regard, the nanometric films of self-assembled BCPs find application not only in microelectronic industry, but also in any field requiring lithographic techniques for nanostructuring of devices, such as, for instance, optoelectronics, solar cells, biological applications and storage on magnetic media.

The procedure of preparation of nanometric films composed of block copolymers (BCP) generally comprises three main steps: a first step of cleaning the substrate, a second step (optional) of neutralisation of the substrate, and a third step of BCP self-assembling.

The first step of cleaning the substrate is specific for the particular material of the substrate, defining a specific cleaning procedure for removing possible contaminants and/or particulate present onto the surface of the substrate. In other words, the chemical recipe of the cleaning procedure is modified depending on the properties of the substrate material. Usually, the most used materials are silicon and silicon oxide.

R. A. Segalman/Materials Science and Engineering R 48 (2005) 191-226

Figure 1:
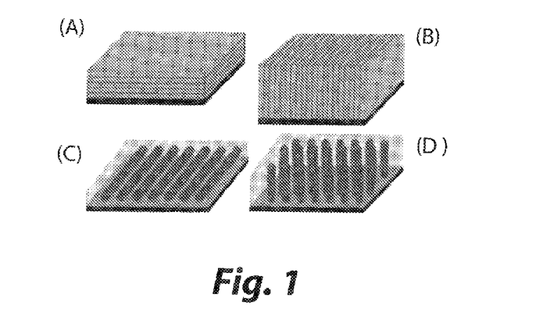
FIG. 1 shows a schematic representation of a nanostructure of self-assembled diblock copolymers with parallel lamellae orientation (FIG. 1A), schematic representation of a nanostructure of self-assembled diblock copolymers with perpendicular lamellae orientation (FIG. 1B), a nanostructure of self-assembled diblock copolymers with parallel cylinder orientation (FIG. 1C), a schematic representation of a nanostructure of self-assembled diblock copolymers with perpendicular cylinder orientation (FIG. 1D)

With reference to FIG. 1 (taken from R. A. Segalman, Materials Science and Engineering R 48 (2005), pp. 191-226), showing by way of example and not by way of limitation nanostructures of self-assembled diblock copolymers, it may be observed that, depending on the application, the nanostructure that is desired to obtain through the self-assembling of the copolymer may have the parallel lamellae orientation of FIG. 1A, the perpendicular lamellae orientation of FIG. 1B, the parallel cylinder orientation of FIG. 1C, or the perpendicular cylinder orientation of FIG. 1D. In order to induce a perpendicular orientation of the (either lamellae or cylinder) structures of the BCP, it is necessary that the wettability of the substrate surface is the same for the two (or more) blocks of the copolymer, i.e. that the substrate surface has a neutral wettability with respect to the two (or more) blocks of the copolymer (as shown in FIGS. 1B and 1D for self-assembled diblock copolymers). Instead, if the sample surface has a preferential wettability with respect to one of the two (or more) blocks, the self-assembling process leads to lamellae or cylinders parallel with respect to the substrate (as shown in FIGS. 1A and 1C for self-assembled diblock copolymers).

As disclosed by P. Mansky et al. in "*Controlling Polymer-Surface Interactions with Random Copolymer Brushes*", Science Vol. 275, no. 5305, pp. 1458-1460, 7 Mar. 1997, in the case where the substrate surface has a preferential wettability, it is possible to modify its wettability, so as to render the same homogeneous for the two (or more) blocks, by introducing a random copolymer (RCP: Random CoPolymer) formed by the same monomers of the block copolymer through the self-assembling of which it is desired to obtain nanostructures with perpendicular orientation. In other words, in the case where the substrate surface is not neutral with respect to the two (or more) blocks, it is necessary to introduce the RCP in order to obtain the perpendicular orientation of the self-assembled BCP.

The second step of neutralisation of the substrate is necessary just to control the substrate wettability with respect to the two (or more) blocks composing the copolymer, just rendering it homogeneous for the two (or more) blocks of the copolymer. In particular, in the second neutralisation step, the RCP is chemically bonded to the substrate surface (this is also indicated as grafting onto the substrate surface) through a thermal process.

Obviously, in the case where the substrate surface is neutral with respect to the two (or more) blocks composing the copolymer, there is no need for introducing the RCP in order to obtain the perpendicular orientation of the BCP; similarly, in the case where the substrate surface has preferential wettability, there is no need for using the RCP in order to obtain the parallel orientation of the BCP. In other words, the second step of neutralisation of the substrate is optional.

In the third step of the block copolymer self-assembling, it is necessary to bring the BCP coated substrate above the glass transition temperature of the latter for guaranteeing a mobility to the polymeric chains and for giving them the possibility of self-organising reaching the condition of thermodynamic equilibrium.

In particular, the substrate material must be compatible with the presence of solvents and with the thermal treatments required for the self-assembling of the BCPs, so as to be capable to withstand the maximum temperature reached during the thermal treatments without degradations or alterations. By way of example, and not by way of limitation, the materials usable for the substrate can be silicon dioxide ($SiO_2$), silicon, zinc oxide (ZnO), permalloy, indium tin oxide (ITO), high permittivity (high-k) dielectrics (in particular oxides), transition metal oxides, rare earth element oxides, and aluminium oxide ($Al_2O_3$). As stated, for each material a specific procedure of cleaning and neutralisation is required.

In the prior art, the grafting of the RCP in the second (optional) step of neutralisation and the self-assembling of the BCP in the third step are normally carried out in a furnace with extremely long processes, lasting from a few hours up to several days. By way of example, and not by way of limitation, some prior art processes are disclosed in documents WO 02/31002 A1, US 2002/190415 A1, US 2005/159293 A1, US 2011/256359 A1, US 2012/094087 A1, WO 2012/106120 A2 and US 2012/223053 A1, in the article by J. Bang et al. "*Block Copolymer Nanolithography: Translation of Molecular Level Control to Nanoscale Patterns*", Advanced Materials, Vol. 21, Issue 47, pp. 4769-4792, 18 Dec. 2009, and in the article by A. Andreozzi et al. *"The fabrication of tunable nanoporous oxide surfaces by block copolymer lithography and atomic layer deposition"*, 2011 Nanotechnology 22 335303, doi: 10.1088/0957-4484/22/33/335303.

Prior art thermal processes carried out in a furnace cause some drawbacks.

First of all, heating in a furnace does not permit to precisely control the thermal rising ramps of the substrate coated with RCP or BCP, whereby also the control of the wettability of the substrate surface and the control of the self-assembling process, respectively, are not completely accurate. In fact, during the heating ramp, the substrate coated with RCP or BCP is kept above the glass transition temperature of the copolymer for many minutes in a non-equilibrium condition that limits the capability of reducing the overall thermal budget to which the sample is subjected. Moreover, the slowness of the heating processes affects evaporation of the solvent latent in the polymeric film previously deposited onto the substrate, causing a significant desorption of the solvent from the film during the heating process well before the sample reaches a temperature higher than the glass transition one. This decreases the mobility of the polymeric chains and slows down the self-assembling process kinetic. The furnace thermal treatment is a purely thermodynamic process, because the grafting of the RCP and the self-assembling of the block copolymer are exclusively controlled by the overall thermal energy transferred to the sample and therefore solely depend on temperature and duration of the thermal treatment.

Moreover, the duration of the thermal treatment increases the costs of manufacture of the final devices; by way of example, in the case where the final devices are microelectronic devices, time scales of the furnace thermal treatments are largely longer than those usually involved in processes of annealing polymeric masks conventionally used in current technologies of manufacturing semiconductor devices (e.g. current silicon technology).

An alternative technique of self-assembling block copolymers comprising a chemical nano structure of the substrate surface is described by G. Liu et al. in *"Nonbulk Complex Structures in Thin Films of Symmetric Block Copolymers on Chemically Nanopatterned Surfaces"*, Macromolecules, 2012, 45 (9), pp 3986-3992. Such technique uses a OH terminated polymer that is fixed to the surface through thermal treatment at 160° C. for 24 hours, and the local wettability at nanometric scale of the polystyrene (PS) film on the surface is controlled through a subsequent lithographic process. However, such alternative technique does not solve the problems related to both the duration of the thermal treatment, that is carried out at 230° C. for 72 hours, and the limits of reduction of size of the BCP structures, and it is not completely effective in the neutralisation of the substrate surface (i.e. in the control of the wettability of the latter).

It is an object of this invention, therefore, to allow to accurately control the manufacture of self-assembled block copolymer films and the related physico-chemical properties in an efficient, reliable, quick, easy-to-manage and inexpensive way.

It is specific subject-matter of the present invention a process for manufacturing self-assembled block copolymer films, having two or more blocks, comprising the following steps:

A. having a substrate;
B. distributing a first solution containing at least one block copolymer onto the substrate so as to at least partially coat a surface of the substrate, obtaining a first intermediate product;
C. making a step of self-assembling said at least one block copolymer by heating the first intermediate product;

wherein the self-assembling step C is made through a first RTP process of Rapid Thermal Processing comprising the following substeps:

C.1 heating the first intermediate product up to a first target temperature, ranging from a glass transition temperature $T_g$ of said at least one block copolymer to an order-disorder transition temperature $T_{ODT}$ of said at least one block copolymer, through a first temperature rising ramp having a first rate of temperature change not lower than 5° C./second;
C.2 maintaining the first intermediate product at said first target temperature for a first time interval not longer than 60 minutes, whereby a sample is obtained on the surface of which a self-assembled film of said at least one block copolymer has been made;
C.3 cooling the sample down to the ambient temperature through a first temperature descending ramp.

According to another aspect of the invention, said first rate of temperature change may be not larger than 300° C./s, optionally not larger than 200° C./s, more optionally ranging from 10° C./s to 50° C./s.

According to a further aspect of the invention, said first time interval may be not longer than 30 minutes, optionally not longer than 5 minutes, more optionally not longer than 1 minute, still more optionally not longer than 10 seconds, even more optionally not longer than 1 second.

According to an additional aspect of the invention, said first RTP process may be made within a chamber and the self-assembling step C may execute, before substep C.1, the following substep at least once, optionally twice:

C.4 emptying said chamber and introducing inert gas.

According to another aspect of the invention, said at least one block copolymer may be selected from the group comprising polystyrene-polyfluorostyrene (PS-PFS), polystyrene-poly(dimethyl siloxane) (PS-PDMS), polystyrene-poly(ethylene oxide) (PS-PEO), polystyrene-poly(methylstyrene) (PS-PMS), polystyrene-poly(4-vinylpyridine) (PS-P4VP), polystyrene-poly(2-vinylpyridine) (PS-P2VP), polystyrene-polylactide (PS-PLA), polystyrene-polyimide (PS-PI), polystyrene-poly(ethylene-propylene) (PS-PEP), polyimide-poly(4-vinylpyridine) (PI-P4VP), polyimide-poly(2-vinylpyridine) (PI-P2VP), polystyrene-poly(acrylic acid) (PS-PAA), polystyrene-poly(butadiene) (PS-PBD), polystyrene-poly(vinylpyridine) (PS-PVP), poly(ethylene-propylene)-poly(ethylethylene) (PEP-PEE), poly(ethylene oxide)-polystyrene (PEO-PS), poly(meth)acrylate based copolymers, polydiene based copolymers, polyisobutylene based copolymers, polystyrene based copolymers, polyvinyl naphthalene based copolymers, polyvinylpyridine based copolymers, polypropylene oxide based copolymers, polysiloxane based copolymers, adipic anhydride based copolymers, polyolefin based copolymers, polylactide based copolymers, polyferrocenyldimethylsilane based copolymers, and polyhedral oligomeric silsesquioxane based copolymers.

According to a further aspect of the invention, said first solution may comprise at least one solvent, optionally selected from the group comprising toluene, acetone, tetrahydrofuran (THF), chloroform, dichloromethane, benzene, methyl ethyl keton (MEK), chlorobenzene, xylene, cyclohexanone, and formic acid.

According to an additional aspect of the invention, said substrate may be made of a material selected from the group comprising silicon dioxide ($SiO_2$), silicon, zinc oxide (ZnO), permalloy, indium tin oxide (ITO), high permittivity (high-k) oxides, transition metal oxides, rare earth element oxides, and aluminium oxide ($Al_2O_3$).

According to another aspect of the invention, the process may comprise, before step B, the following steps:

D. distributing a second solution containing at least one random copolymer onto the substrate so as to at least partially coat said surface of the substrate, obtaining a second intermediate product;

E. making a step of neutralisation of said surface of said substrate through a second RTP process of Rapid Thermal Processing comprising the following substeps:

E.1 heating the second intermediate product up to a second target temperature, ranging from a glass transition temperature $T_g$ of said at least one random copolymer to an order-disorder transition temperature $T_{ODT}$ of said at least one random copolymer, through a second temperature rising ramp having a second rate of temperature change not lower than 5° C./second, optionally not larger than 300° C./s, more optionally not larger than 200° C./s, still more optionally ranging from 10° C./s to 50° C./s;

E.2 maintaining the second intermediate product at said second target temperature for a second time interval not longer than 60 minutes, optionally not longer than 30 minutes, more optionally not longer than 20 minutes, still more optionally not longer than 5 minutes, even more optionally not longer than 1 minute, whereby said at least one random copolymer is chemically bonded to said surface of said substrate so that said surface of said substrate is neutralised;

E.3 cooling said substrate with said neutralised surface down to the ambient temperature through a second temperature descending ramp.

According to a further aspect of the invention, the neutralisation step E may further comprise, after step E.3, the following substep:

E.4 making a low-power sonication of said substrate with said neutralised surface, optionally by heating said substrate with said neutralised surface in an ultrasonic bath in at least one solvent, optionally selected from the group comprising toluene, acetone, tetrahydrofuran (THF), chloroform, dichloromethane, benzene, methyl ethyl keton (MEK), chlorobenzene, xylene, cyclohexanone, and formic acid.

According to an additional aspect of the invention, said second RTP process may be made in a chamber and that the neutralisation step E executes, before substep E.1, the following substep at least once, optionally twice:

E.5 emptying said chamber and introducing inert gas.

According to another aspect of the invention, said at least one random copolymer may be selected from the group comprising polystyrene-polyfluorostyrene (PS-PFS), polystyrene-poly(dimethyl siloxane) (PS-PDMS), polystyrene-poly(ethylene oxide) (PS-PEO), polystyrene-poly(methylstyrene) (PS-PMS), polystyrene-poly(4-vinylpyridine) (PS-P4VP), polystyrene-poly(2-vinylpyridine) (PS-P2VP), polystyrene-polylactide (PS-PLA), polystyrene-polyimide (PS-PI), polystyrene-poly(ethylene-propylene) (PS-PEP), polyimide-poly(4-vinylpyridine) (PI-P4VP), polyimide-poly(2-vinylpyridine) (PI-P2VP), polystyrene-poly(acrylic acid) (PS-PAA), polystyrene-poly(butadiene) (PS-PBD), polystyrene-poly(vinylpyridine) (PS-PVP), poly(ethylene-propylene)-poly(ethylethylene) (PEP-PEE), and poly(ethylene oxide)-polystyrene (PEO-PS).

According to a further aspect of the invention, said second solution may comprise at least one solvent, optionally selected from the group comprising toluene, acetone, tetrahydrofuran (THF), clorofromio, dichloromethane, benzene, methyl ethyl keton (MEK), chlorobenzene, xylene, cyclohexanone, and formic acid.

According to an additional aspect of the invention, step A may comprise the following substep:

A.1 chemically cleaning said surface of said substrate so as to remove contaminants and/or particulate possibly present onto said surface of said substrate.

It is still specific subject-matter of the present invention a self-assembled block copolymer film, having two or more blocks, the film being manufactured through the manufacturing process previously described.

The advantages offered by the process for manufacturing self-assembled block copolymer films according to the invention are numerous and significant.

First of all, the process according to the invention allows to largely reduce the duration of the thermal treatments down to time scales compatible with requirements of microelectronics, consequently limiting costs. In fact, with respect to the conventional furnace thermal treatments, and to the processes of annealing the block copolymers films at low temperature in saturated solvent atmosphere (commonly called "solvent annealing"), it is possible to scale the duration from several tens of minutes down to times less than 1 minute. Also, with respect to the conventional furnace thermal treatments, there is an intrinsic time reduction related to the rate of the rising and descending ramps which are limited in the furnace processes by the thermal inertia of the system. In particular, this entails a significant reduction of both times necessary for the (optional) grafting of the RCPs used for the neutralisation of the substrate and times necessary for the self-assembling of the BCPs.

Also, the process according to the invention allows an accurate control of all the process parameters, with particular reference to the temperature rising and descending ramps and the related rates of temperature variation, the duration of which is extremely reduced (e.g. when compared with the furnace thermal treatments). This permits to maintain the presence of residual solvent within the film, allowing the self-assembling process to be controlled in a more accurate way with respect to the conventional thermal treatments.

Furthermore, the process according to the invention is completely compatible with current technologies of manufacturing semiconductor devices (e.g. with current silicon technology). In fact, differently for instance from the solvent annealing processes, the process according to the invention uses equipments already present in the production lines of microelectronics, which hence do not require the development of specific systems.

The present invention will be now described, by way of illustration and not by way of limitation, according to its preferred embodiments, by particularly referring to the Figures of the annexed drawings, in which.

In the Figures identical reference numerals will be used for alike elements.

The process for manufacturing self-assembled block copolymer films according to the invention makes use of the treatment of Rapid Thermal Processing, also known as RTP process, thanks to which the thermal treatments required for the self-assembling of the self-assembling BCPs for the possible preliminary neutralisation of the substrate surface through RCPs are made at reduced time scales. As known, the RTP process is usually carried out in a chamber provided with high power light sources (e.g. halogen lamps or gas discharge lamps) directed towards the sample to heat.

In the following of the present description reference is mainly made to embodiments of the process according to the invention wherein a substrate undergoes a step of neutralisation of its surface through RCP copolymers before being subjected to the step of self-assembling the BCPs. However, it must be understood that the step of neutralisation is optional and not essential for the process according to the invention. By way of example, in the case where the substrate surface is neutral, the process according to the invention may comprise the step of self-assembling the BCPs for obtaining the perpendicular orientation of the BCPs without the preliminary step of neutralisation; similarly, in the case where the substrate surface has preferential wettability, the process according to the invention may comprise the step of self-assembling the BCPs for obtaining the parallel orientation of BCP without the preliminary step of neutralisation.

Starting from a substrate compatible with the presence of solvents and with the temperatures of the RTP thermal treatments (e.g., SiO$_2$, Si, ZnO, Permalloy, ITO, high-k dielectrics, transition metal oxides, rare earth element oxides, Al$_2$O$_3$), which substrate has been preliminarily subjected to a cleaning procedure for removing possible contaminants and/or particulate present onto the surface, the process according to the invention comprises a step of neutralisation of the substrate in which the grafting of the RCP through RTP treatment is carried out at temperatures higher than the glass transition temperature of the random copolymer.

Afterwards, the process according to the invention comprises a step of self-assembling in which the neutralised sample is coated with the BCP and subjected to another RTP process, comprising:

heating the sample, i.e. the neutralised sample the neutralised surface of which is coated with the BCP, up to a first target temperature through a first temperature rising ramp;

carrying out an isothermal step of heating the sample, i.e. keeping the sample at constant temperature for a first time interval, so as to make the self-assembled film of BCP onto its surface; in particular, the first time interval is not longer than 60 minutes, optionally not longer than 30 minutes, more optionally not longer than 5 minutes, still more optionally not longer than 1 minute, even more optionally not longer than 10 seconds;

cooling the sample onto the surface of which the self-assembled film of BCP has been made, down to ambient temperature through a first temperature descending ramp.

In particular, the RTP treatment made in the step of neutralisation comprises, once that the substrate surface (onto which it is desired to obtain the self-assembled block copolymer film) has been coated with the RCP:

heating the sample, i.e. the substrate one surface of which is coated with RCP, up to a second target temperature (that may coincide with the first target temperature or not) through a second temperature rising ramp;

carrying out an isothermal step of heating the sample, i.e. keeping the sample at constant temperature for a second time interval; in particular, the second time interval is not longer than 60 minutes, optionally not longer than 30 minutes, more optionally not longer than 20 minutes, still more optionally not longer than 5 minutes, even more optionally not longer than 1 minute;

cooling the neutralised sample, i.e. the substrate onto the neutralised surface of which the RCP has been chemically bonded, down to ambient temperature through a second temperature descending ramp.

Figure 2:
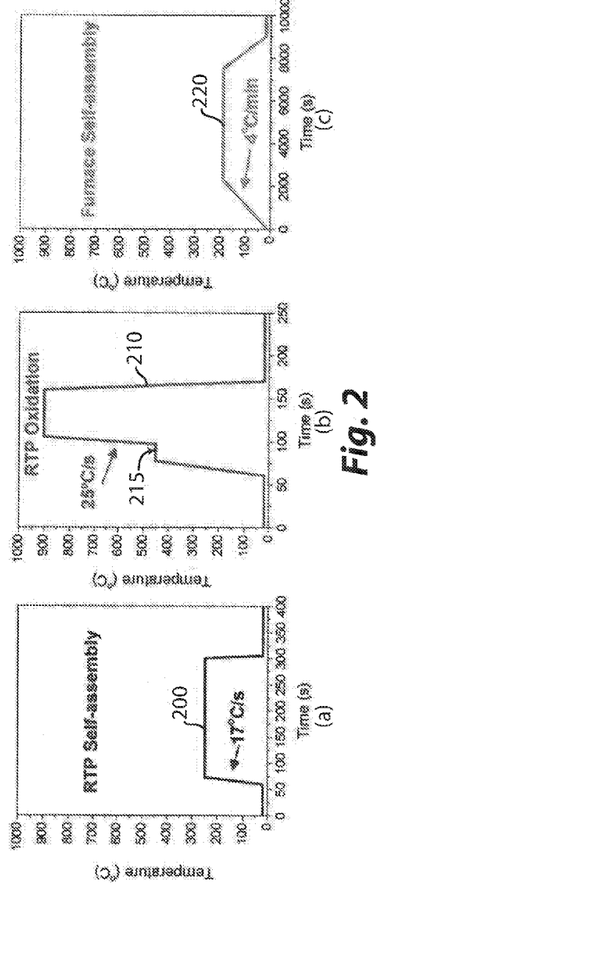
FIG. 2 shows three graphs of the temperature behaviour in RTP treatment made in the self-assembling step of the preferred embodiment of the process according to the invention (FIG. 2a), the temperature behaviour in a RTP treatment of prior art silicon wafer oxidation (FIG. 2b), the temperature behaviour in a step of prior art BCP self-assembling in a furnace (FIG. 2c)

FIG. 2 shows the temperature behaviour 200 in the RTP treatment carried out in the self-assembling step of the preferred embodiment of the process according to the invention (FIG. 2a), the temperature behaviour 210 in a RTP treatment of oxidation of the silicon wafer (FIG. 2b), and the temperature behaviour 220 in a conventional step of self-assembling BCPs in furnace (FIG. 2c). With respect to a conventional self-assembling step made in a furnace, wherein the rate of sample heating (i.e. the rate of the first temperature rising ramp) is very slow, of the order of 1-10° C./minute, the use of the RTP process permits to set much quicker rising ramps. This is due to the fact that in a conventional furnace the whole system is brought to temperature, while in the RTP process the light sources (e.g. halogen lamps or gas discharge lamps) heats only the sample, keeping the chamber at lower temperature. This possibility guarantees a greater control on the total thermal budget, permitting to precisely manage the kinetics of the system. The rising ramps in a RTP process may be varied, depending on the specific RTP apparatus used, in a very wide range of values that may extend from a lower limit of 5° C./second to an upper limit of 300° C./second or even higher. Such upper limit depends on the technical features of the RTP apparatus and it is not a limitation for the process of self-assembling the block copolymers. The inventors have ascertained that the larger the control on the temperature rising rate, in the sense that as much constant such rate is, the better the control of the self-assembling process.

With respect to the temperature rising ramps commonly used for the conventional RTP processes such as the oxidation of silicon wafers, the self-assembling RTP process used in the process according to the invention is carried out at lower temperature. As shown in FIG. 2b, in the first case reaching the final temperature, ranging from 900° C. to 1000° C., requires the subdivision of the rising ramp into one or more temperature steps (in FIG. 2b only one step indicated with reference numeral 215 is shown) in order to avoid substrate cracks due to thermal stresses. Differently, in the self-assembling RTP process used in the process according to the invention, the temperature rising ramp is composed of a single heating step, bringing the sample to the equilibrium temperature (previously called as the first target temperature) in few seconds, as shown in FIG. 2a.

Figure 3:
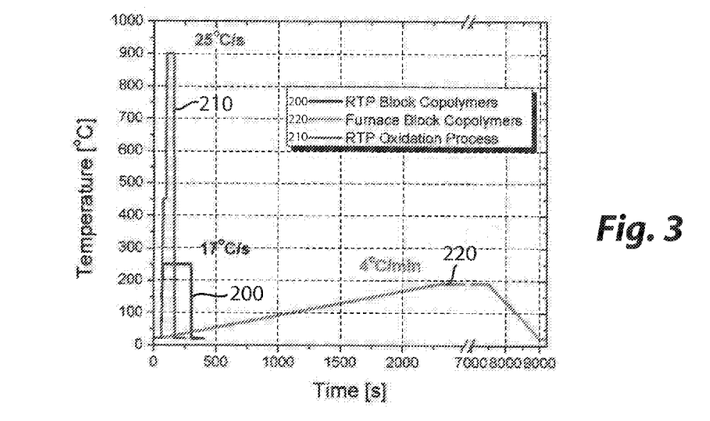
FIG. 3 shows in a sole graph the three temperature behaviours of FIGS. 2a, 2b and 2c.

FIG. 3 shows a sole graph comprising the three temperature behaviours of FIGS. 2a, 2b and 2c for a more immediate comparison also with reference to the different duration of the three processes. In this regard, it must be understood that the values of temperature and temperature rising rates reported in FIGS. 2 and 3 are illustrative and not limiting. In particular, the first target temperature (also called in the following as first annealing temperature) may be varied depending on the specific BCP used in a range of values included between the glass transition temperature $T_g$ and the order-disorder transition temperature $T_{ODT}$ of the BCP that is treated. Similarly, the rising and descending ramps may have rate of temperature change variable in a range of values going from a lower limit of 5° C./second to an upper limit of 300° C./second or even higher, depending on the specific RTP apparatus that is used. The inventors have successfully explored the possibility of controlling the rising ramps by using values of temperature rising rate equal to 5° C./s, 17° C./s, 29° C./s and 38° C./s. In this regard, as known, the glass transition temperature is the temperature below which the block copolymer (or the random copolymer) behaves as a glassy solid and above which the translational movements of the composing molecules are permitted, consequently promoting the process of self-assembling the BCPs.

Still with reference to FIG. 2a, before carrying out the heating through RTP process of the samples, the chamber of the RTP apparatus is emptied and inert gas (e.g. nitrogen or argon) is then introduced therein. Such cycle of emptying the chamber of the RTP apparatus and of introducing inert gas is optionally repeated twice in order to eliminate possible oxygen residuals. At the end of this operation, of total duration approximately equal to 100 seconds, the chamber is saturated with inert gas and it is at ambient temperature (about 22° C.) and the temperature rising ramp of the RTP process starts by powering up the high power light sources (e.g. halogen lamps or gas discharge lamps), whereby the temperature on the sample increases with a rate not lower than 5° C./s, optionally not higher than 300° C./s, more optionally ranging from 5° C./s to 200° C./s, still more optionally ranging from 10° C./s to 50° C./s. Since the temperature is generally not higher than 350° C., because most part of polymers degrades if brought above such temperature, the temperature is monitored in real time through a thermocouple placed in contact with the back of the sample subjected to the heating RTP process. In particular, the upper limit of temperature of the RTP process is determined by the properties of the BCP and specifically by the order-disorder transition temperature $T_{ODT}$ and by the degradation temperature of the BCP deposited in the form of thin film. The cooling of the sample is carried out by powering down the light sources, and the total cooling time is much shorter with respect to what occurs in a conventional furnace, since the thermal inertia that the system has is simply that of the sample, and not that of the whole chamber. The variation of inert gas flow in the chamber also allows to vary within certain limits the cooling rate: by increasing the inert gas flow heat is more quickly taken away from the sample.

What has been just described with reference to FIGS. 2 and 3 for the RTP process used in the self-assembling step of the process according to the invention is also valid for the RTP process used in the step of neutralisation of the substrate surface.

The grafting of the RCP and the self-assembling of the BCP through respective RTP processes depend on some other main parameter: besides the glass transition temperature of the random or block copolymer, the presence and type of the solvent, the annealing temperature (i.e. the first and second target temperatures), the degradation temperature of the random or block copolymer, and the temperature rising rate.

In particular, the self-assembling of the BCP is strongly depending on the presence of the solvent within the BCP coating the neutralised substrate, since the solvent increases the copolymer plasticity allowing the molecules to move also at temperatures lower than the glass transition one. Moreover, depending on the type of solvent used it is possible to obtain a preferential expansion of one of the two (or more) polymers composing the block copolymer. In this regard, the surface of the neutralised substrate is optionally coated with BCPs through rotation of the substrate at high rpm so as to homogeneously distribute the BCP onto the surface (as the surface of the substrate to neutralise is coated with RCP); however, it must be understood that the process according to the invention may use any technique of distribution of the solution containing the block copolymer (or the random copolymer) onto the substrate so as to at least partially coat the substrate surface, for instance through micro- or nano-fluidic tools (such as the FluidFM tool available from the Swiss company Nanosurf AG) configured to distribute onto the surface even two or more different block copolymers, for instance in different areas (possibly separated) of the substrate surface.

The annealing temperature must be higher than the glass transition temperature: the speed of the process of self-assembling the block copolymers directly depends on this parameter, i.e. on the annealing temperature.

The annealing temperature must be lower than the degradation temperature of the random or block copolymer, that is the temperature at which the random or block copolymer begins to lose mass due to the degradation and/or rupture of the polymeric chains. Above this degradation temperature, the physico-chemical properties of the copolymer consistently vary and the obtainable self-assembled block copolymer films are not of good quality.

Figure 4:
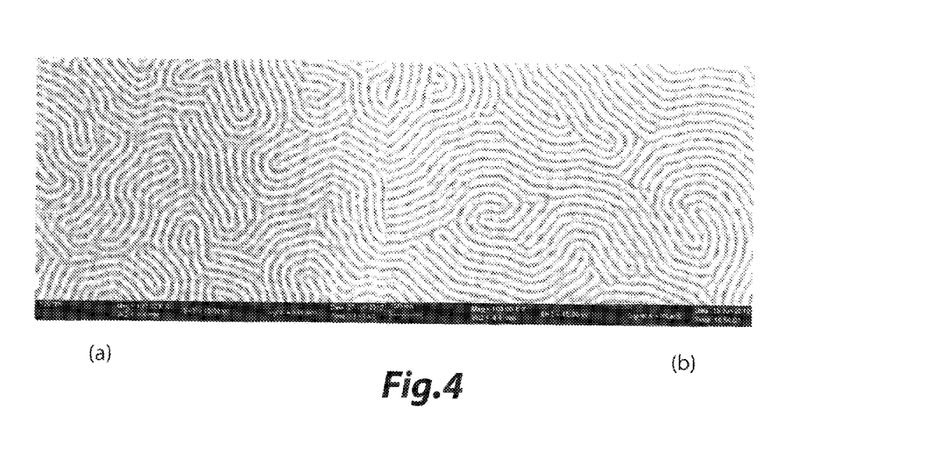
FIG. 4 shows two SEM images related to lamellar phase separation polystyrene-b-poly(methyl methacrylate) (PS-b-PMMA) block copolymer organised on a silicon dioxide (SiO$_2$) substrate by using toluene (FIG. 4a) or acetone (FIG. 4b) as solvent.

The temperature rising rate impacts on the evaporation of the latent solvent within the polymeric film coating the substrate already neutralised through the RCP. The experimental results obtained by the inventors show that, depending on the used solvent, it is possible to direct the process of self-assembling the block copolymers and to modify the final morphology of the copolymer in a manner similar to what observed with the processes of solvent annealing. In particular, the inventors have experimented several solvents, such as toluene, acetone, tetrahydrofuran (THF), chloroform, dichloromethane, benzene, methyl ethyl keton (MEK), chlorobenzene, xylene, cyclohexanone, and formic acid. FIG. 4 shows the results obtained with lamellar phase separation polystyrene-b-poly(methyl methacrylate) (PS-b-PMMA) block copolymer organised on a silicon dioxide ($SiO_2$) substrate by using toluene (FIG. 4a) or acetone (FIG. 4b) as solvent. In FIG. 4a two phases of the block copolymer are clearly visible.

The solvent annealing process is based on the idea of inducing the process of self-assembling the polymeric film in an environment saturated with solvent vapours. As stated, the presence of the solvent increases the plasticity of the film and hence the mobility of the polymeric chains. Consequently, the self-assembling process may be induced also at low temperatures, optionally lower than 100° C., and in relatively short times, optionally shorter than 60 minutes. The particular choice of a preferential solvent for one of the two blocks of the copolymer also permits to control the final morphology of the polymeric film passing from the lamellar phase to the cylindrical (or even spherical) one and vice versa.

In the RTP process the polymeric film is brought very quickly to temperatures higher than the glass transition temperature, avoiding the complete desorption of the solvent from the film during the process of heating of the sample. This consequently increases the mobility of the polymeric chains and speeds up the kinetics of the self-assembling process. Moreover the presence of residual solvent within the polymeric film during the thermal treatment permits to modify the final morphology of the polymeric film by choosing an adequate solvent.

The preferred embodiment of the process for manufacturing self-assembled block copolymer films according to the invention makes PS-b-PMMA block copolymers onto a substrate of silicon dioxide previously functionalised with a nanometric layer of PS-r-PMMA random copolymer. The recipe used in the preferred embodiment of the process according to the invention may be used on other substrates and with other types of block copolymers by simply varying the parameters of deposition, such variation being within the reach of those skilled in the art.

First of all, the silicon dioxide substrates undergo a cleaning step comprising:
submerging the substrates in a bath of a solution of sulphuric acid ($H_2SO_4$) and hydrogen peroxide ($H_2O_2$) in 3/1 solution at 80° C. for 40 minutes, and
cleaning the substrates in isopropanol in a high power ultrasonic bath for 5-20 min.

Afterwards, the preferred embodiment of the process according to the invention comprises a step of neutralisation of the substrate surface through grafting of PS-r-PMMA random copolymer. In particular, such step comprises:
dissolving the PS-r-PMMA random copolymer in toluene with a variable percentage in weight depending on the specific type of random copolymer; by way of example, and not by way of limitation, in case of PS-r-PMMA random copolymer with molecular weight Mn equal to 11 kg/mol or equal to 13 kg/mol, 18 mg of copolymer in 2 ml of toluene are used;
rotating a determined amount of solution (depending on the substrate size, e.g. 30 µL) at a speed variable between 1000 and 6000 rpm for a time of 20-120 s;
carrying out an annealing RTP process at a temperature included between 160° C. and 280° C. for a time period included between 1 and 20 minutes (temperature and duration may vary depending on the type of random copolymer used);
carrying out a low-power sonication of the heated sample in an ultrasonic bath in toluene; in particular, this operation allows to eliminate the chains of random copolymer which are not grafted (i.e. not chemically bonded to the substrate surface), and it may be carried out also with other solvents (different from toluene).

Afterwards, the preferred embodiment of the process according to the invention comprises a step of self-assembling the block copolymer, comprising:
dissolving the block copolymer in toluene with a variable percentage in weight depending on the monomers composing the block copolymer used and on the number of monomers forming the polymeric chain (i.e. the molecular weight) of the specific copolymer used; by way of example, and not by way of limitation, in case of lamellar phase separation PS-b-PMMA block copolymer with molecular weight equal to 51 kg/mol (with PS:PMMA=50:50) 16 mg of copolymer in 2 ml of toluene are used, while in case of cylindrical phase separation PS-b-PMMA block copolymer with molecular weight equal to 67 kg/mol (with PS:PMMA=71:29) 18 mg of copolymer in 2 ml of toluene are used;
rotating a determined amount (depending on the substrate size, e.g. 30 µL) of solution at a speed variable between 1000 and 6000 rpm for a time of 20-120 s; in particular, the variation of rate and duration of the rotation permits to vary the final thickness of deposition of the polymeric film;
carrying out an annealing RTP process at a temperature included between 160° C. and 290° C. for a time period not longer than 60 minutes, optionally not longer than 30 minutes, more optionally not longer than 5 minutes, still more optionally not longer than 1 minute, even more optionally not longer than 10 seconds (temperature and duration may vary depending on the type of block copolymer used).

Although the preferred embodiment of the process for manufacturing self-assembled block copolymer films according to the invention uses BCPs of lamellar (PS 50%) or cylindrical (PS 71%) phase separation PS-b-PMMA, other embodiments of the process for manufacturing self-assembled block copolymer films according to the invention may use other copolymers.

By way of example, and not by way of limitation, the inventors have applied the process according to the invention to BCPs of cylindrical (PS 70%) phase separation PS-b-PMMA with molecular weights equal to 39 kg/mol, 55 kg/mol, 67 kg/mol, 88 kg/mol, 102 kg/mol, 122 kg/mol and 205 kg/mol, and to BCPs of lamellar phase separation PS-b-PMMA with molecular weights equal to 51 kg/mol and 412 kg/mol. In particular, the inventors have made self-assembled BCP films of cylindrical (PS 70%) phase separation PS-b-PMMA with molecular weights equal to 67 kg/mol through annealing RTP processes both with temperature of 280° C. and duration equal to 10 seconds and with temperature of 290° C. and duration equal to 1 second, and they have further made self-assembled BCP films of lamellar phase separation PS-b-PMMA with molecular weights equal to 51 kg/mol through annealing RTP processes both with temperature of 280° C. and duration equal to 10 seconds and with temperature of 290° C. and duration equal to 1 second.

Similarly, as far as the neutralisation step is concerned, the inventors have applied the RTP thermal treatment to PS-r-PMMA RCPs with different fractions of PS respectively equal to 58% and 62%.

Other embodiments of the process for manufacturing self-assembled block copolymer films according to the invention may use any type of block copolymer and optionally any type of random copolymer, for instance copolymers which may be treated through conventional thermal processes in furnace. By way of example, and not by way of limitation, the possible block and/or random copolymers which may be used in the process for manufacturing self-assembled block copolymer films according to the invention comprise: polystyrene-polyfluorostyrene (PS-PFS), polystyrene-poly(dimethyl siloxane) (PS-PDMS), polystyrene-poly (ethylene oxide) (PS-PEO), polystyrene-poly(methylstyrene) (PS-PMS), polystyrene-poly(4-vinylpyridine) (PS-P4VP), polystyrene-poly(2-vinylpyridine) (PS-P2VP), polystyrene-polylactide (PS-PLA), polystyrene-polyimide (PS-PI), polystyrene-poly(ethylene-propylene) (PS-PEP), polyimide-poly(4-vinylpyridine) (PI-P4VP), polyimide-poly(2-vinylpyridine) (PI-P2VP), polystyrene-poly(acrylic acid) (PS-PAA), polystyrene-poly(butadiene) (PS-PBD), polystyrene-poly(vinylpyridine) (PS-PVP), poly(ethylene-propylene)-poly(ethylethylene) (PEP-PEE), and poly(ethylene oxide)-polystyrene (PEO-PS).

For each copolymer listed above it must be understood that the molecular weights and the fraction of the polymers forming the same block copolymer may vary. Preferably, the polydispersity or polydispersity index is close to unity for allowing a better process of phase separation and of self-organisation of the copolymer. Moreover, although the list above is limited to diblock copolymers, however, it must be understood that the process according to the invention is also applicable to the manufacture of copolymers with more than two blocks, e.g. triblock copolymers.

Still by way of example, and not by way of limitation, the possible block copolymers which may be used in the process for manufacturing self-assembled block copolymer films according to the invention may comprise the following copolymers (described in the web page at the address https://www.securewebexchange.com/polymersource.com/browse1.php?ID=23) available from the Canadian company Polymer Source Inc.: poly(meth)acrylate based copolymers; polydiene based copolymers; polyisobutylene based copolymers; polystyrene based copolymers; polyvinyl naphthalene based copolymers; polyvinylpyridine based copolymers; polypropylene oxide based copolymers; polysiloxane based copolymers; adipic anhydride based copolymers; polyolefin based copolymers; polylactide based copolymers; polyferrocenyldimethylsilane based copolymers; polyhedral oligomeric silsesquioxane based copolymers.

Still by way of example, and not by way of limitation, the possible random copolymers which may be used in the process for manufacturing self-assembled block copolymer films according to the invention may comprise the copolymers described in the web page at the address https://www.securewebexchange.com/polymersource.com/browse1.php?ID=23 also available from the Canadian company Polymer Source Inc.

The process for manufacturing self-assembled block copolymer films according to the invention is applicable in all the fields requiring lithographic techniques for nanostructuring of devices, such as, for instance, microelectronic industry, optoelectronics, solar cells, biological applications and storage on magnetic media.

The preferred embodiments of this invention have been described and a number of variations have been suggested hereinbefore, but it should be understood that those skilled in the art can make variations and changes, without so departing from the scope of protection thereof, as defined by the attached claims.

The invention claimed is:
1. Process for manufacturing self-assembled block copolymer films, having two or more blocks, comprising the following steps:
   A. having a substrate;
   B. distributing a first solution containing at least one block copolymer onto the substrate so as to at least partially coat a surface of the substrate, obtaining a first intermediate product;
   C. making a step of self-assembling said at least one block copolymer by heating the first intermediate product;

wherein the self-assembling step C is made through a first RTP process of Rapid Thermal Processing comprising the following substeps:
   C.1 heating the first intermediate product up to a first target temperature, ranging from a glass transition temperature $T_g$ of said at least one block copolymer to an order-disorder transition temperature $T_{ODT}$ of said at least one block copolymer, through a first temperature rising ramp having a first rate of temperature change not lower than 5° C./second;
   C.2 maintaining the first intermediate product at said first target temperature for a first time interval not longer than 60 minutes, whereby a sample is obtained on the surface of which a self-assembled film of said at least one block copolymer has been made;
   C.3 cooling the sample down to the ambient temperature through a first temperature descending ramp.

2. Process according to claim 1, wherein said first rate of temperature change is not larger than 300° C./s.

3. Process according to claim 1, wherein said first time interval is not longer than 30 minutes.

4. Process according to claim 1, wherein said first RTP process is made within a chamber and wherein the self-assembling step C executes, before substep C.1, the following substep at least once:
   C.4 emptying said chamber and introducing inert gas.

5. Process according to claim 1, wherein said at least one block copolymer is selected from the group comprising polystyrene-polyfluorostyrene (PS-PFS), polystyrene-poly(dimethyl siloxane) (PS-PDMS), polystyrene-poly(ethylene oxide) (PS-PEO), polystyrene-poly(methylstyrene) (PS-PMS), polystyrene-poly(4-vinylpyridine) (PS-P4VP), polystyrene-poly(2-vinylpyridine) (PS-P2VP), polystyrene-polylactide (PS-PLA), polystyrene-polyimide (PS-PI), polystyrene-poly(ethylene-propylene) (PS-PEP), polyimide-poly(4-vinylpyridine) (PI-P4VP), polyimide-poly(2-vinylpyridine) (PI-P2VP), polystyrene-poly(acrylic acid) (PS-PAA), polystyrene-poly(butadiene) (PS-PBD), polystyrene-poly(vinylpyridine) (PS-PVP), poly(ethylene-propylene)-poly(ethylethylene) (PEP-PEE), poly(ethylene oxide)-polystyrene (PEO-PS), poly(meth)acrylate based copolymers, polydiene based copolymers, polyisobutylene based copolymers, polystyrene based copolymers, polyvinyl naphthalene based copolymers, polyvinylpyridine based copolymers, polypropylene oxide based copolymers, polysiloxane based copolymers, adipic anhydride based copolymers, polyolefin based copolymers, polylactide based copolymers, polyferrocenyldimethylsilane based copolymers, and polyhedral oligomeric silsesquioxane based copolymers.

6. Process according to claim 1, wherein said first solution comprises at least one solvent.

7. Process according to claim 1, wherein said substrate is made of a material selected from the group comprising silicon dioxide ($SiO_2$), silicon, permalloy, and oxides including indium tin oxide (ITO), zinc oxide (ZnO), transition metal oxides, rare earth element oxides, and aluminium oxide ($Al_2O_3$).

8. Process according to claim 1, wherein it comprises, before step B, the following steps:
   D distributing a second solution containing at least one random copolymer onto the substrate so as to at least partially coat said surface of the substrate, obtaining a second intermediate product;
   E. making a step of neutralisation of said surface of said substrate through a second RTP process of Rapid Thermal Processing comprising the following substeps:

E.1 heating the second intermediate product up to a second target temperature, ranging from a glass transition temperature $T_g$ of said at least one random copolymer to an order-disorder transition temperature $T_{ODT}$ of said at least one random copolymer, through a second temperature rising ramp having a second rate of temperature change not lower than 5° C./second;

E.2 maintaining the second intermediate product at said second target temperature for a second time interval not longer than 60 minutes, whereby said at least one random copolymer is chemically bonded to said surface of said substrate so that said surface of said substrate is neutralised;

E.3 cooling said substrate with said neutralised surface down to the ambient temperature through a second temperature descending ramp.

9. Process according to claim 8, wherein the neutralisation step E further comprises, after step E.3, the following substep:

E.4 making a sonication of said substrate with said neutralised surface.

10. Process according to claim 8, wherein said second RTP process is made in a chamber and wherein the neutralisation step E executes, before substep E.1, the following substep at least once:

E.5 emptying said chamber and introducing inert gas.

11. Process according to claim 8, wherein said at least one random copolymer is selected from the group comprising polystyrene-polyfluorostyrene (PS-PFS), polystyrene-poly(dimethyl siloxane) (PS-PDMS), polystyrene-poly(ethylene oxide) (PS-PEO), polystyrene-poly(methylstyrene) (PS-PMS), polystyrene-poly(4-vinylpyridine) (PS-P4VP), polystyrene-poly(2-vinylpyridine) (PS-P2VP), polystyrene-polylactide (PS-PLA), polystyrene-polyimide (PS-PI), polystyrene-poly(ethylene-propylene) (PS-PEP), polyimide-poly(4-vinylpyridine) (PI-P4VP), polyimide-poly(2-vinylpyridine) (PI-P2VP), polystyrene-poly(acrylic acid) (PS-PAA), polystyrene-poly(butadiene) (PS-PBD), polystyrene-poly(vinylpyridine) (PS-PVP), poly(ethylene-propylene)-poly(ethylethylene) (PEP-PEE), and poly(ethylene oxide)-polystyrene (PEO-PS).

12. Process according to claim 8, wherein said second solution comprises at least one solvent.

13. Process according to claim 1, wherein step A comprises the following substep:

A.1 chemically cleaning said surface of said substrate so as to remove contaminants and/or particulate possibly present onto said surface of said substrate.

14. Process according to claim 2, wherein said first rate of temperature change ranges from 10° C./s to 50° C./s.

15. Process according to claim 3, wherein said first time interval is not longer than 1 second.

16. Process according to claim 4, wherein substep C.4 is executed twice.

17. Process according to claim 8, wherein in substep E.1 said second temperature rising ramp has a second rate of temperature change ranging from 10° C./s to 50° C./s.

18. Process according to claim 8, wherein in substep E.2 said second time interval is not longer than 1 minute.

19. Process according to claim 9, wherein substep E.4 is executed by heating said substrate with said neutralised surface in an ultrasonic bath in at least one solvent.

20. Process according to claim 10, wherein substep E.5 is executed twice.

* * * * *